(12) United States Patent
Lee et al.

(10) Patent No.: US 11,854,632 B2
(45) Date of Patent: Dec. 26, 2023

(54) SEMICONDUCTOR MEMORY STRUCTURE AND FABRICATION METHOD THEREOF

(71) Applicant: UNITED MICROELECTRONICS CORP., Hsin-Chu (TW)

(72) Inventors: Kuo-Hsing Lee, Hsinchu County (TW); Chien-Liang Wu, Tainan (TW); Wen-Kai Lin, Yilan County (TW); Te-Wei Yeh, Kaohsiung (TW); Sheng-Yuan Hsueh, Tainan (TW); Chi-Horn Pai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 279 days.

(21) Appl. No.: 17/502,056

(22) Filed: Oct. 15, 2021

(65) Prior Publication Data
US 2023/0081533 A1   Mar. 16, 2023

(30) Foreign Application Priority Data
Sep. 16, 2021   (CN) .......................... 202111085199.9

(51) Int. Cl.
*G11C 17/16* (2006.01)
*G11C 16/10* (2006.01)
*H10B 20/25* (2023.01)
*H10B 20/20* (2023.01)

(52) U.S. Cl.
CPC ............ *G11C 17/165* (2013.01); *G11C 16/10* (2013.01); *H10B 20/20* (2023.02); *H10B 20/25* (2023.02); *G11C 2216/26* (2013.01)

(58) Field of Classification Search
CPC ... G11C 17/165; G11C 16/10; G11C 2216/26; G11C 17/16; H10B 20/20; H10B 20/25
See application file for complete search history.

(56) References Cited

U.S. PATENT DOCUMENTS

| | | | |
|---|---|---|---|
| 7,868,371 B2 * | 1/2011 | Kim | ....................... H10B 20/20 257/317 |
| 9,502,424 B2 | 11/2016 | Wang | |
| 11,152,512 B2 * | 10/2021 | Yamazaki | ........... H01L 29/7869 |
| 2009/0014766 A1 | 1/2009 | Kim | |

(Continued)

OTHER PUBLICATIONS

Lee, the specification, including the claims, and drawings in the U.S. Appl. No. 17/323,863, filed May 18, 2021.

*Primary Examiner* — Allison Bernstein
(74) *Attorney, Agent, or Firm* — Winston Hsu (57) ABSTRACT

A semiconductor memory structure includes a substrate having thereon a transistor forming region and a capacitor forming region. A transistor is disposed on the substrate within the transistor forming region. A capacitor is disposed within the capacitor forming region and electrically coupled to the transistor. A first inter-layer dielectric layer covers the transistor forming region and the capacitor forming region. The first inter-layer dielectric layer surrounds a metal gate of the transistor and a bottom plate of the capacitor. A cap layer is disposed on the first inter-layer dielectric layer. The cap layer has a first thickness within the transistor forming region and a second thickness within the capacitor forming region. The first thickness is greater than the second thickness. The cap layer within the capacitor forming region acts as a capacitor dielectric layer of the capacitor.

20 Claims, 6 Drawing Sheets

(56) References Cited

U.S. PATENT DOCUMENTS

2022/0336479 A1* 10/2022 Lee .................. H10B 20/20
2023/0147512 A1* 5/2023 Lee .................. H01L 28/75
　　　　　　　　　　　　　　　　　　　257/288

* cited by examiner

SEMICONDUCTOR MEMORY STRUCTURE AND FABRICATION METHOD THEREOF

BACKGROUND OF THE INVENTION

1. Field of the Invention

The present invention relates to the field of semiconductor technology, in particular to one-time programmable (OTP) memory cells and a method for manufacturing the same.

2. Description of the Prior Art

With the growth of solid-state non-volatile memories (NVM) in storing configuration settings, program code, application parameters and data in consumer, industrial and automotive electronics, demand for embedded NVM is rapidly increasing.

Figure 1:
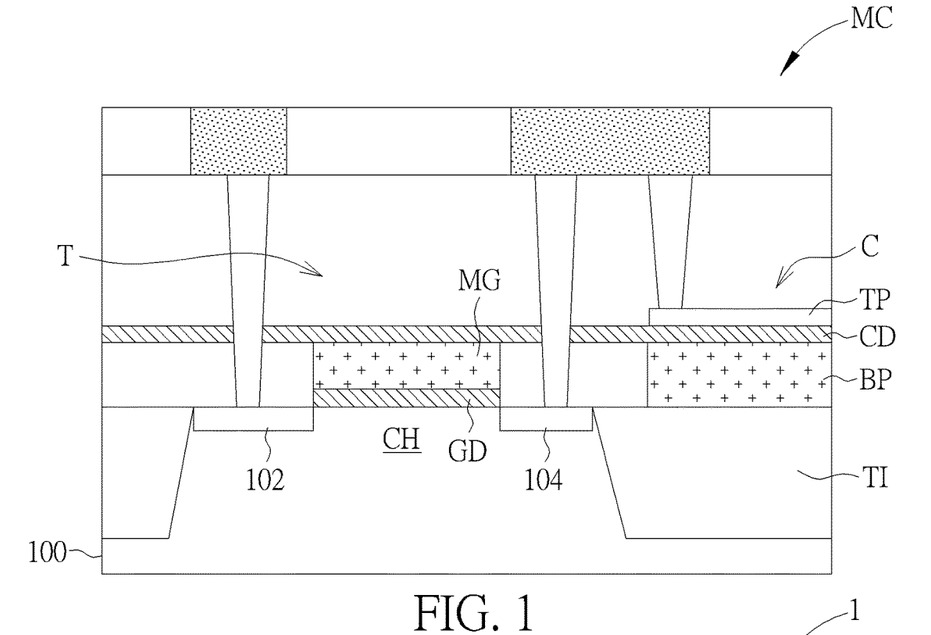
FIG. 1 illustrates a schematic cross-sectional view of an OTP memory cell with a single transistor and a single capacitor.

Recently, the anti-fuse variable one-time programmable (OTP) memory cell has been developed due to its non-volatile strength and compatibility with logic technology. FIG. 1 illustrates a cross-sectional schematic diagram of an OTP memory cell MC with a single transistor and a single capacitor (1T1C). As shown in FIG. 1, the OTP memory cell MC with a single transistor and a single capacitor includes a transistor T and a capacitor C. The transistor T includes doped regions 102 and 104 in the substrate 100, a channel region CH between the doped regions 102 and 104, a gate electrode MG on the channel region CH, and a gate dielectric layer GD between the gate electrode MG and the channel region CH. The doped region 104 is electrically connected to a top plate TP of the capacitor C through an interconnect structure. The capacitor C includes the top plate TP, a bottom plate BP, and a capacitor dielectric layer CD between the bottom plate BP and the top electrode plate TP. The bottom plate BP of the capacitor C and the gate electrode MG of the transistor T are manufactured at the same time, and the bottom plate BP of the capacitor C is disposed on the trench isolation structure TI.

In the above-mentioned OTP memory cell structure, the capacitor dielectric layer CD of the capacitor C also serves as a cap layer of the transistor T to protect the metal gate MG underneath during the high-resistance metal etching process. Therefore, the capacitor dielectric layer CD needs to have a sufficient thickness. However, since the thickness of the capacitor dielectric layer CD cannot be further reduced, the breakdown voltage of the capacitor C cannot be reduced.

SUMMARY OF THE INVENTION

It is one objective of the present invention to provide an improved semiconductor memory structure and manufacturing method thereof to solve the deficiencies or shortcomings of the prior art.

One aspect of the invention provides a semiconductor memory structure including a substrate having thereon a transistor forming region and a capacitor forming region in proximity to the transistor forming region; a transistor disposed on the substrate within the transistor forming region; a capacitor disposed on the substrate within the capacitor forming region and electrically coupled to a terminal of the transistor; and a first interlayer dielectric layer covering the transistor forming region and the capacitor forming region. The first interlayer dielectric layer surrounds a metal gate of the transistor and a bottom plate of the capacitor. A cap layer is disposed on the first interlayer dielectric layer. The cap layer has a first thickness within the transistor forming region and a second thickness within the capacitor forming region. The first thickness is greater than the second thickness. The cap layer within the capacitor forming region acts as a capacitor dielectric layer of the capacitor.

According to some embodiments, the capacitor further includes a top plate on the cap layer within the capacitor forming region.

According to some embodiments, the semiconductor memory structure further includes a second interlayer dielectric layer covering the cap layer and the top plate.

According to some embodiments, the bottom plate is a metal gate bottom plate.

According to some embodiments, the bottom plate is coplanar with the metal gate of the transistor.

According to some embodiments, the top plate comprises titanium nitride or tantalum nitride.

According to some embodiments, the first thickness is about 200-300 angstroms and the second thickness is about 20-50 angstroms.

According to some embodiments, the cap layer is a silicon oxide layer.

According to some embodiments, the cap layer has a composition in the transistor forming region different from that of the cap layer in the capacitor forming region.

According to some embodiments, the semiconductor memory structure further includes a trench isolation structure in the substrate within the capacitor forming region, wherein the bottom plate is disposed directly on the trench isolation structure.

Another aspect of the invention provides a method of forming a semiconductor memory structure. A substrate having thereon a transistor forming region and a capacitor forming region in proximity to the transistor forming region is provided. A transistor on the substrate is formed within the transistor forming region. A capacitor on the substrate is formed within the capacitor forming region and electrically coupled to a terminal of the transistor. A first interlayer dielectric layer is formed to cover the transistor forming region and the capacitor forming region. The first interlayer dielectric layer surrounds a metal gate of the transistor and a bottom plate of the capacitor. A cap layer is formed on the first interlayer dielectric layer. The cap layer has a first thickness within the transistor forming region and a second thickness within the capacitor forming region. The first thickness is greater than the second thickness. The cap layer within the capacitor forming region acts as a capacitor dielectric layer of the capacitor.

According to some embodiments, forming the capacitor further comprises forming a top plate on the cap layer within the capacitor forming region.

According to some embodiments, a second interlayer dielectric layer is formed to cover the cap layer and the top plate.

According to some embodiments, the bottom plate is a metal gate bottom plate.

According to some embodiments, the bottom plate is coplanar with the metal gate of the transistor.

According to some embodiments, the top plate comprises titanium nitride or tantalum nitride.

According to some embodiments, the first thickness is about 200-300 angstroms and the second thickness is about 20-50 angstroms.

According to some embodiments, the cap layer is a silicon oxide layer.

According to some embodiments, the cap layer has a composition in the transistor forming region different from that of the cap layer in the capacitor forming region.

According to some embodiments, a trench isolation structure is formed in the substrate within the capacitor forming region. The bottom plate is disposed directly on the trench isolation structure.

One technical feature of the present invention is that the cap layer has a thicker first portion and a third portion which are respectively located in the transistor forming region and the resistor forming region, and the thinner second portion is located in the capacitor forming region. This can effectively reduce the breakdown voltage of the capacitor and at the same time protect the metal gate of the transistor.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 2:
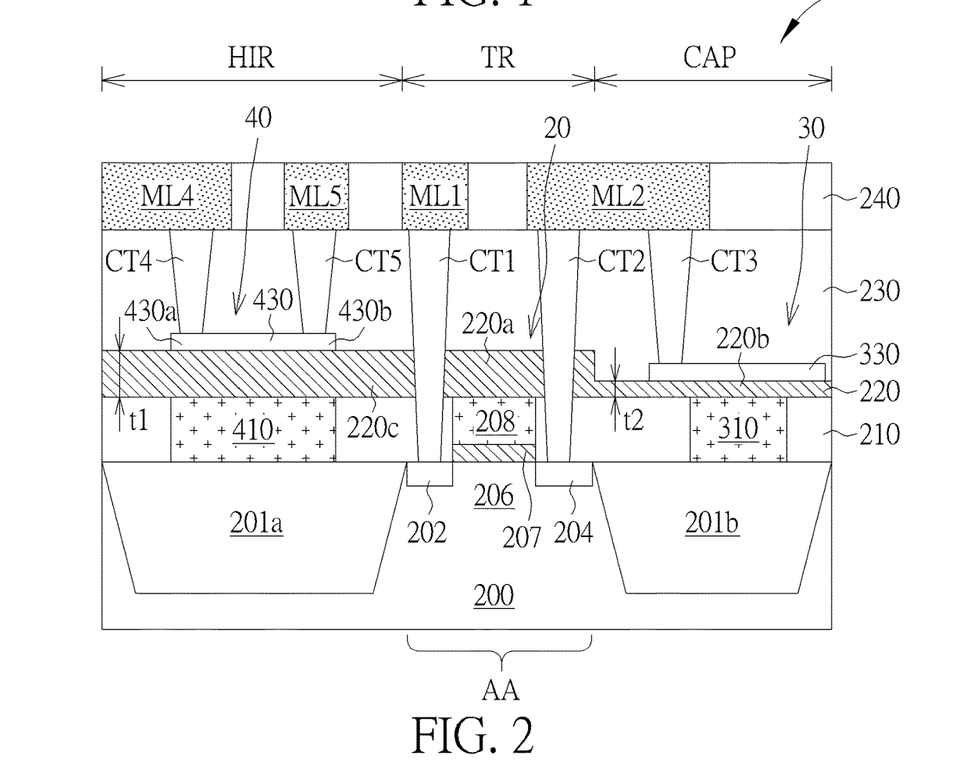
FIG. 2 is a schematic cross-sectional view of a semiconductor memory structure according to an embodiment of the invention.

Please refer to FIG. 2, which is a schematic cross-sectional view of the semiconductor memory structure 1 according to an embodiment of the present invention. The semiconductor memory structure 1 may be, for example, a one-time programmable (OTP) memory cell. As shown in FIG. 2, the semiconductor memory structure 1 includes a substrate 200, for example, a silicon substrate. According to an embodiment of the present invention, the substrate 200 may have a first conductivity type, for example, a P type. According to an embodiment of the present invention, the substrate 200 may include a resistor forming region HIR, a transistor forming region TR, and a capacitor forming region CAP close to the transistor forming region TR.

According to an embodiment of the present invention, the semiconductor memory structure 1 includes a transistor 20 disposed on the substrate 200 in the transistor forming region TR. According to an embodiment of the present invention, the transistor 20 is formed in the active area AA surrounded by the trench isolation structures 201a and 201b. According to an embodiment of the present invention, the trench isolation structure 201a is located in the resistor forming region HIR, and the trench isolation structure 201b is located in the capacitor forming region CAP.

According to an embodiment of the present invention, the semiconductor memory structure 1 further includes a capacitor 30 directly disposed on the trench isolation structure 201b in the capacitor forming region CAP and electrically connected to a terminal of the transistor 20, for example, the doped region 204.

According to an embodiment of the present invention, the transistor 20 may be an NMOS transistor. According to an embodiment of the present invention, the transistor 20 includes a doped region 202 located in the substrate 200 and having a second conductivity type (e.g., N-type), and the doped region 204 located in the substrate 200 and having the second conductivity type (e.g., N-type), a channel region 206 located in the substrate 200 and between the doped region 202 and the doped region 204, and a metal gate 208 on the channel region 206.

According to an embodiment of the present invention, the transistor 20 further includes a gate dielectric layer 207 located between the channel region 206 and the metal gate 208. According to an embodiment of the present invention, the gate dielectric layer 207 may include a silicon oxide layer and a high dielectric constant (high-k) film. According to an embodiment of the present invention, the silicon oxide layer is under the high-k film and directly contacts the surface of the substrate 200. According to an embodiment of the present invention, the metal gate 208 may include, for example, titanium, titanium nitride, tantalum, tantalum nitride, tungsten, aluminum, or any combination thereof, but is not limited thereto. According to an embodiment of the present invention, sidewall spacers (not shown in the figure) may be formed on the metal gate 208.

According to an embodiment of the present invention, a first interlayer dielectric layer 210 is provided on the substrate 200, covering the transistor forming region TR, the capacitor forming region CAP and the resistor forming region HIR. The first interlayer dielectric layer 210 surrounds the metal gate 208 of the transistor 20 and the bottom plate 310 of the capacitor 30. According to an embodiment of the present invention, the bottom plate 310 is a metal gate bottom plate, which is formed together with the metal gate 208, so the bottom plate 310 and the metal gate 208 have the same structure. According to an embodiment of the present invention, the bottom plate 310 and the metal gate 208 of the transistor 20 are coplanar. According to an embodiment of the present invention, the bottom plate 310 directly contacts the trench isolation structure 201b.

According to an embodiment of the present invention, the semiconductor memory structure 1 further includes a cap layer 220 located on the first interlayer dielectric layer 210. The cap layer 220 has a first thickness t1 in the transistor forming region TR and has a second thickness t2 in the capacitor forming region CAP. The first thickness t1 is greater than the second thickness t2. According to an embodiment of the present invention, the first thickness t1 is about 200-300 angstroms and the second thickness t2 is about 20-50 angstroms. According to an embodiment of the present invention, the cap layer 220 may be a silicon oxide layer.

In other words, the cap layer 220 has a thicker first portion 220a and a third portion 220c, which are located in the transistor forming region TR and the resistor forming region HIR, respectively, and a thinner second portion 220b, which is located in the capacitor forming region CAP. There is a step difference between the first portion 220a and the second portion 220b. According to an embodiment of the present invention, the composition of the cap layer 220 in the transistor forming region TR and the composition of the cap layer 220 in the capacitor forming region CAP may be different. For example, the first portion 220a may be a silicon oxide layer, and the second portion 220b may include a high-k dielectric layer, such as aluminum oxide, hafnium oxide, tantalum oxide, zirconium oxide, or the like.

According to an embodiment of the present invention, the capacitor 30 further includes a top plate 330 disposed on the second portion 220b of the cap layer 220 in the capacitor forming region CAP. According to an embodiment of the present invention, the second portion 220b of the cap layer 220 is located between the top plate 330 and the bottom plate 310, and serves as a capacitor dielectric layer of the capacitor 30 in the capacitor forming region CAP.

According to an embodiment of the present invention, on the third portion 220c of the cap layer 220 in the resistor forming region HIR, a resistor 40 is provided, which is composed of a high-resistance metal layer 430 and has two terminals 430a and 430b, which are respectively cathode and anode. According to an embodiment of the present invention, the high-resistance metal layer 430 of the resistor 40 and the top plate 330 of the capacitor 30 are formed at the same time. For example, the top plate 330 and the high-resistance metal layer 430 may comprise titanium nitride or tantalum nitride. According to an embodiment of the present invention, a dummy gate 410 is provided under the third portion 220c of the cap layer 220 in the resistor forming region HIR to increase the yield and reliability during the formation of the resistor 40. According to an embodiment of the present invention, the dummy gate 410, the bottom plate 310 and the metal gate 208 are formed at the same time, so they have the same structure.

According to an embodiment of the present invention, the semiconductor memory structure 1 further includes a second interlayer dielectric layer 230 covering the cap layer 220, the top plate 330 and the high-resistance metal layer 430. On the second interlayer dielectric layer 230, an intermetal dielectric layer 240 is disposed, for example, a low-k dielectric layer or an ultra-low-k dielectric layer.

According to an embodiment of the present invention, a plurality of plugs CT1 to CT5 are provided in the second interlayer dielectric layer 230. The plugs CT1 and CT2 penetrate downwardly through the first portion 220a of the cap layer 220 and the first interlayer dielectric layer 210 to electrically connect to the doped region 202 and the doped region 204 of the transistor 20, respectively. The plug CT1 is electrically connected to the interconnect ML1 located in the intermetal dielectric layer 240. The plug CT2 is electrically connected to the interconnect ML2 located in the intermetal dielectric layer 240, and is then electrically connected to the top plate 330 via the plug CT3 The interconnects ML4 and ML5 in the intermetal dielectric layer 240 are electrically connected to the two terminals 430a and 430b of the resistor 40 through the plugs CT4 and CT5, respectively.

One technical feature of the present invention is that the cap layer has a thicker first portion and a third portion which are respectively located in the transistor forming region and the resistor forming region, and the thinner second portion is located in the capacitor forming region. This can effectively reduce the breakdown voltage of the capacitor and at the same time protect the metal gate of the transistor.

Figure 3:
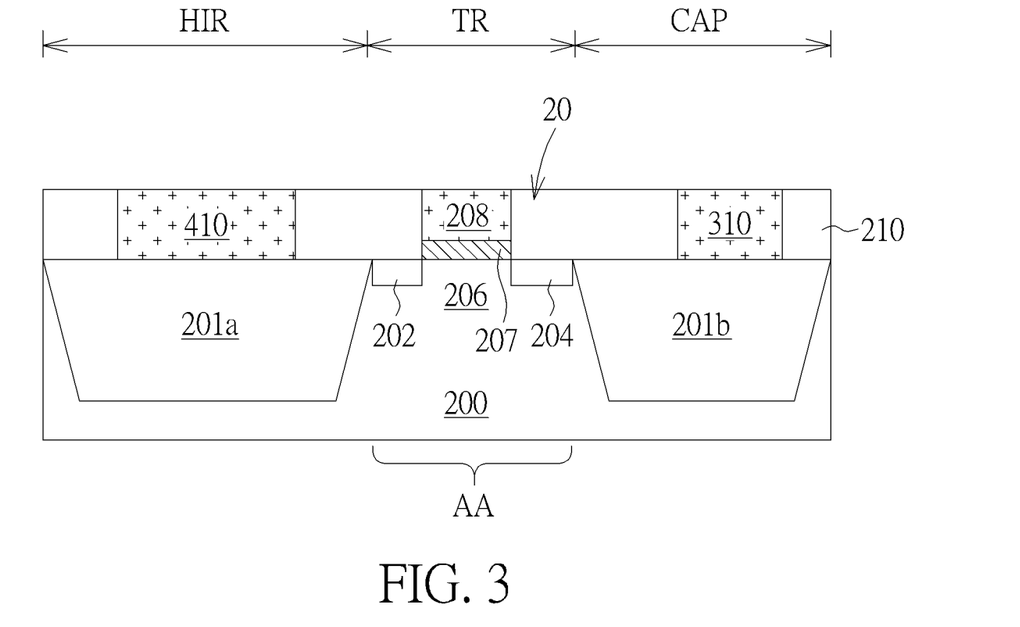
FIG. 3 to FIG. 8 are schematic cross-sectional views illustrating a method of forming a semiconductor memory structure according to an embodiment of the present invention.

Please refer to FIG. 3 to FIG. 8, which are schematic cross-sectional diagrams showing a method for forming a semiconductor memory structure according to an embodiment of the present invention, wherein like regions, layers or materials are designated by like numeral numbers or labels. As shown in FIG. 3, a substrate 200, for example, a silicon substrate is provided. According to an embodiment of the present invention, the substrate 200 may have a first conductivity type, for example, a P type. According to an embodiment of the present invention, the substrate 200 may include a resistor forming region HIR, a transistor forming region TR, and a capacitor forming region CAP in proximity to the transistor forming region TR.

A transistor 20 is formed on the substrate 200 in the transistor forming region TR. According to an embodiment of the present invention, the transistor 20 is formed in the active area AA surrounded by the trench isolation structures 201a and 201b. According to an embodiment of the present invention, the trench isolation structure 201a is located in the resistor forming region HIR, and the trench isolation structure 201b is located in the capacitor forming region CAP.

According to an embodiment of the present invention, the transistor 20 may be an NMOS transistor. According to an embodiment of the present invention, the transistor 20 includes a doped region 202 located in the substrate 200 and having a second conductivity type (e.g., N-type), and a doped region 204 located in the substrate 200 and having the second conductivity type (e.g., N-type), a channel region 206 located in the substrate 200 and between the doped region 202 and the doped region 204, and the metal gate 208 on the channel region 206.

According to an embodiment of the present invention, the transistor 20 further includes a gate dielectric layer 207 located between the channel region 206 and the metal gate 208. According to an embodiment of the present invention, the gate dielectric layer 207 may include a silicon oxide layer and a high-k film. According to an embodiment of the present invention, the silicon oxide layer is under the high-k film and directly contacts the surface of the substrate 200. According to an embodiment of the present invention, the metal gate 208 may include, for example, titanium, titanium nitride, tantalum, tantalum nitride, tungsten, aluminum, or any combination thereof, but is not limited thereto. According to an embodiment of the present invention, sidewall spacers (not shown in the figure) may be formed on the metal gate 208.

According to an embodiment of the present invention, a dummy gate 410 and a bottom plate 310 of the capacitor 30 are formed on the trench isolation structures 201a and 201b in the resistor forming region HIR and the capacitor forming region CAP, respectively. According to an embodiment of the present invention, a first interlayer dielectric layer 210 is provided on the substrate 200 to cover the transistor forming region TR, the capacitor forming region CAP and the resistor forming region HIR. The first interlayer dielectric layer 210 surrounds the metal gate 208 of the transistor 20, the dummy gate 410, and the bottom plate 310 of the capacitor 30. According to an embodiment of the present invention, the dummy gate 410, the bottom plate 310 and the metal gate 208 are formed at the same time using a replacement metal gate (RMG) process, so they have the same structure. Through the chemical mechanical polishing (CMP) process, the top surfaces of the dummy gate 410, the bottom plate 310, and the metal gate 208 are flush with the top surface of the first interlayer dielectric layer 210.

Figure 4:
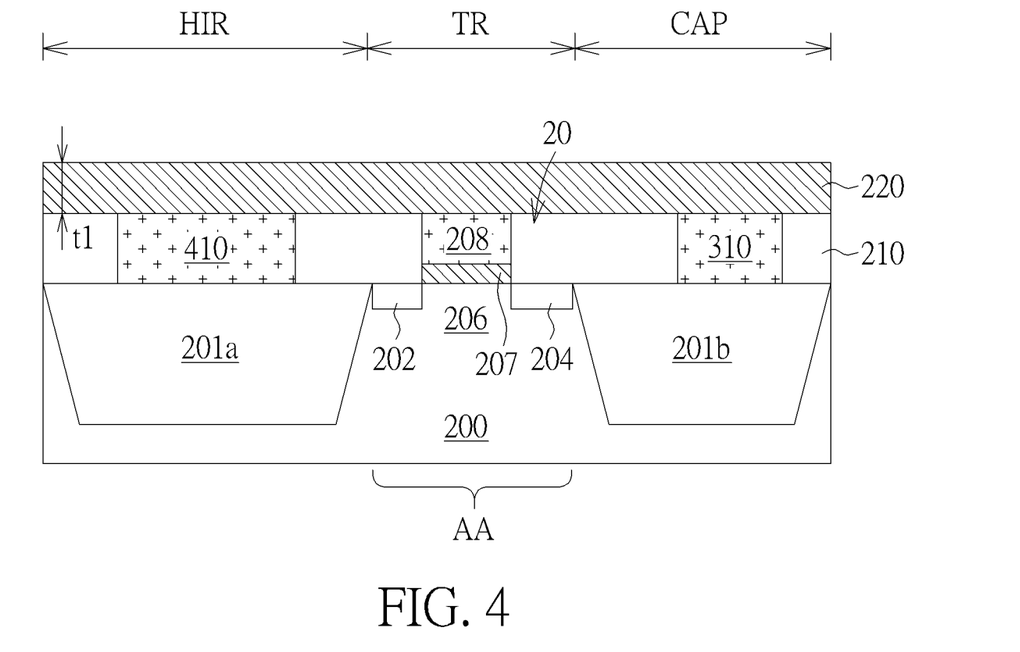

As shown in FIG. 4, a cap layer 220 is then deposited on the substrate 200 in a blanket manner to cover the transistor forming region TR, the capacitor forming region CAP, and the resistor forming region HIR. According to an embodiment of the present invention, the cap layer 220 has a first thickness t1, for example, about 200-300 angstroms. According to an embodiment of the present invention, the cap layer 220 may be a silicon oxide layer.

Figure 5:
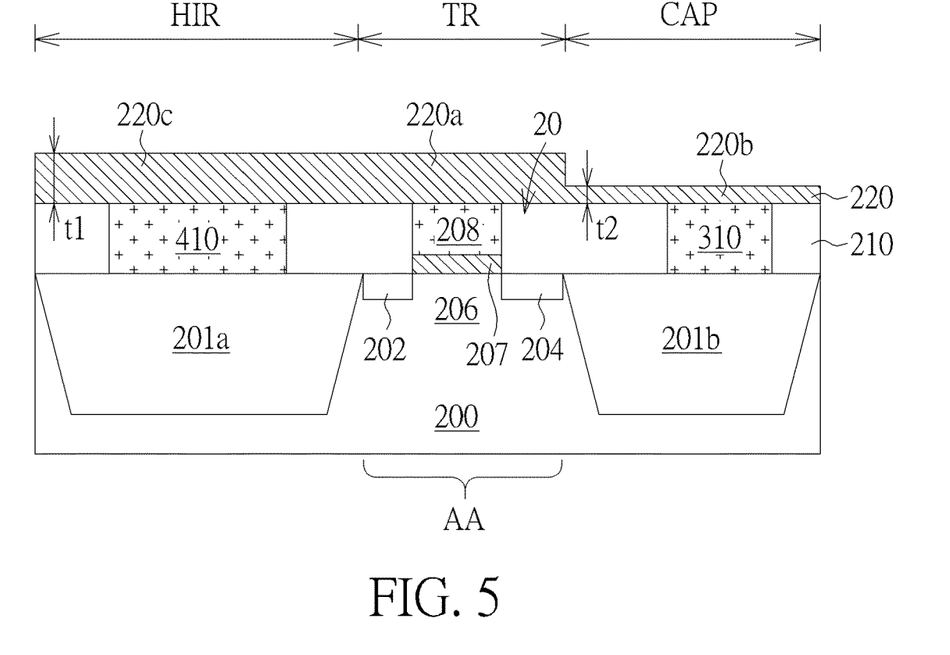

As shown in FIG. 5, using a photolithographic process and an etching process, the cap layer 220 located in the capacitor forming region CAP is partially etched, so that the thickness of the cap layer 220 in the capacitor forming region CAP is reduced from the first thickness t1 to the second thickness t2. For example, the second thickness t2 is about 20-50 angstroms. The cap layer 220 has a thicker first portion 220a and third portion 220c, which are located in the transistor forming region TR and the resistor forming region HIR, respectively, and a thinner second portion 220b, which is located in the capacitor forming region CAP. There is a step difference between the first portion 220a and the second portion 220b.

Figure 6:
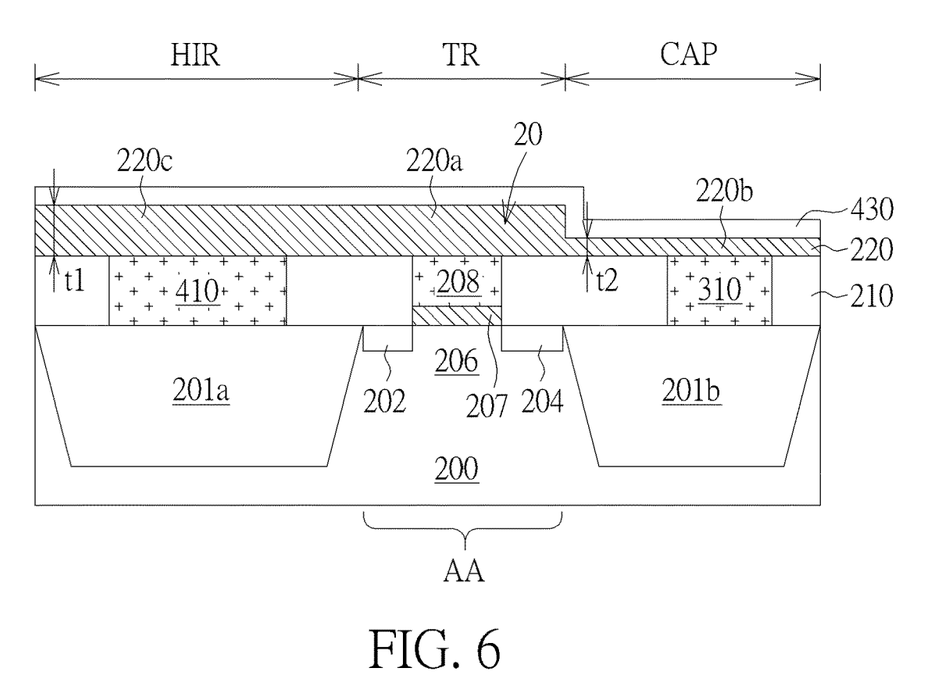

As shown in FIG. 6, a high-resistance metal layer 430, such as titanium nitride or tantalum nitride, is then deposited on the substrate 200 to cover the transistor forming region TR, the capacitor forming region CAP and the resistor forming region HIR.

Figure 7:
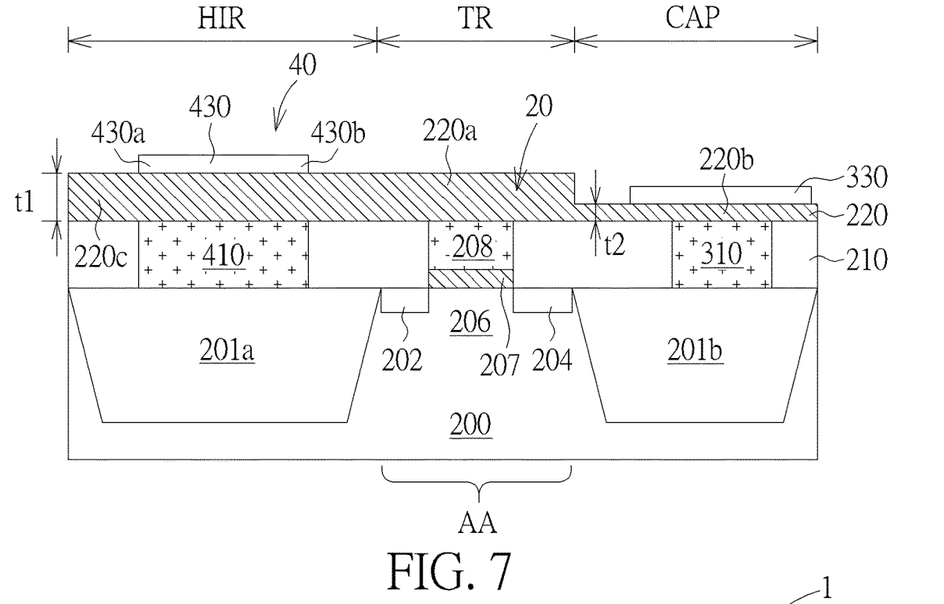

As shown in FIG. 7, next, using a lithographic process and an etching process, the high-resistance metal layer 430 is patterned into the top plate 330 of the resistor 40 in the resistor forming region HIR and the top plate 330 of the capacitor 30 in the capacitor forming region CAP, respectively. The resistor 40 has two terminals 430a and 430b, which are cathode and anode, respectively.

Figure 8:
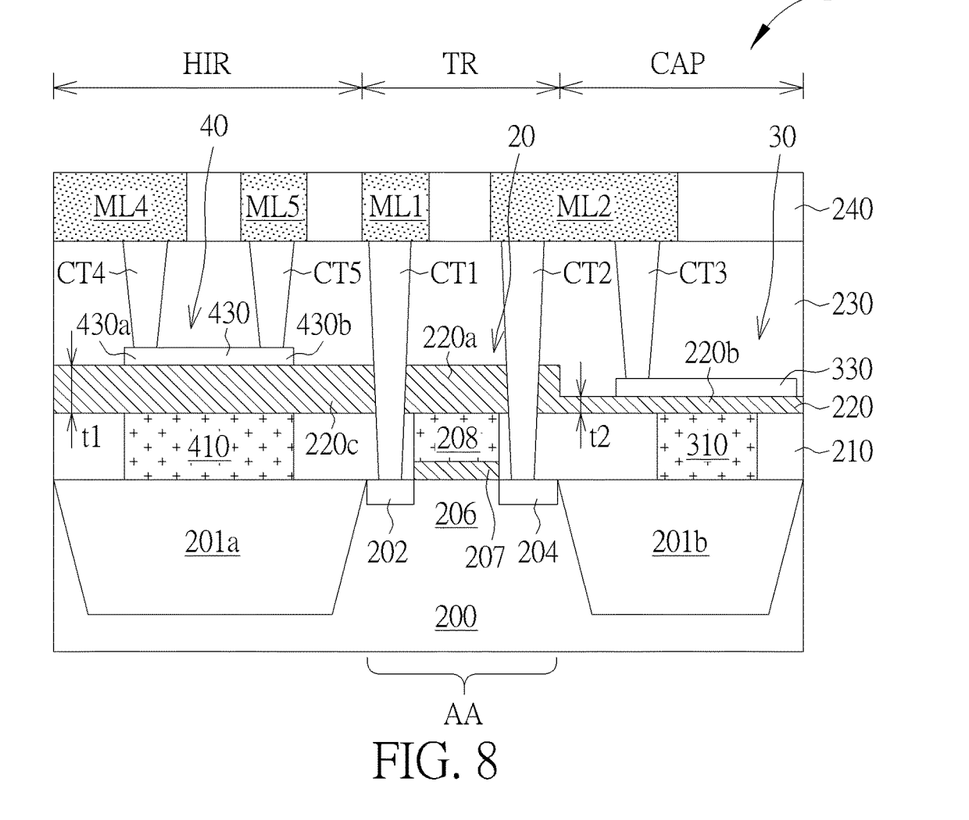

As shown in FIG. 8, next, an interconnection process is performed. A first interlayer dielectric layer 230 is formed on the substrate 200 to cover the transistor forming region TR, the capacitor forming region CAP and the resistor forming region HIR. Subsequently, plugs CT1 to CT5 are formed in the first interlayer dielectric layer 230. An intermetal dielectric layer 240, for example, a low-k dielectric layer or an ultra-low-k dielectric layer is then deposited on the first interlayer dielectric layer 230. Then, interconnects ML1 to ML5 are formed in the intermetal dielectric layer 240. The plugs CT1 and CT2 penetrate downwardly through the first portion 220a of the cap layer 220 and the first interlayer dielectric layer 210, and are electrically connected to the doped region 202 and the doped region 204 of the transistor 20, respectively. The plug CT1 is electrically connected to the interconnect ML1 located in the intermetal dielectric layer 240. The plug CT2 is electrically connected to the interconnect ML2 located in the intermetal dielectric layer 240, and is then electrically connected to the top plate 330 via the plug CT3. The interconnects ML4 and ML5 in the intermetal dielectric layer 240 are electrically connected to the two terminals 430a and 430b of the resistor 40 through the plugs CT4 and CT5, respectively.

Figure 9:
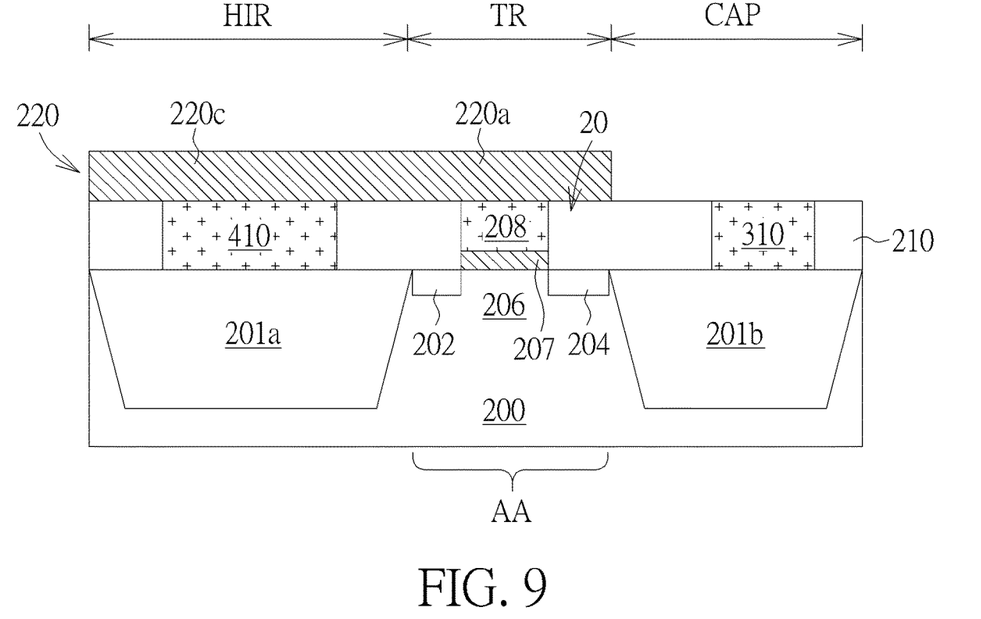
FIG. 9 to FIG. 12 are schematic cross-sectional views illustrating a method of forming a semiconductor memory structure according to another embodiment of the present invention.

Please refer to FIG. 9 to FIG. 12, which are schematic cross-sectional views of a method for forming a semiconductor memory structure according to another embodiment of the present invention, wherein like regions, layers or materials are designated by like numeral numbers or labels. As shown in FIG. 9, the cap layer 220 located in the capacitor forming region CAP is completely removed by using a lithographic process and an etching process, leaving only the first portion 220a and the third part 220c of the cap layer 220, which are respectively located in the transistor forming region TR and resistor forming region HIR. At this point, the bottom plate 310 in the capacitor forming region CAP is exposed.

Figure 10:
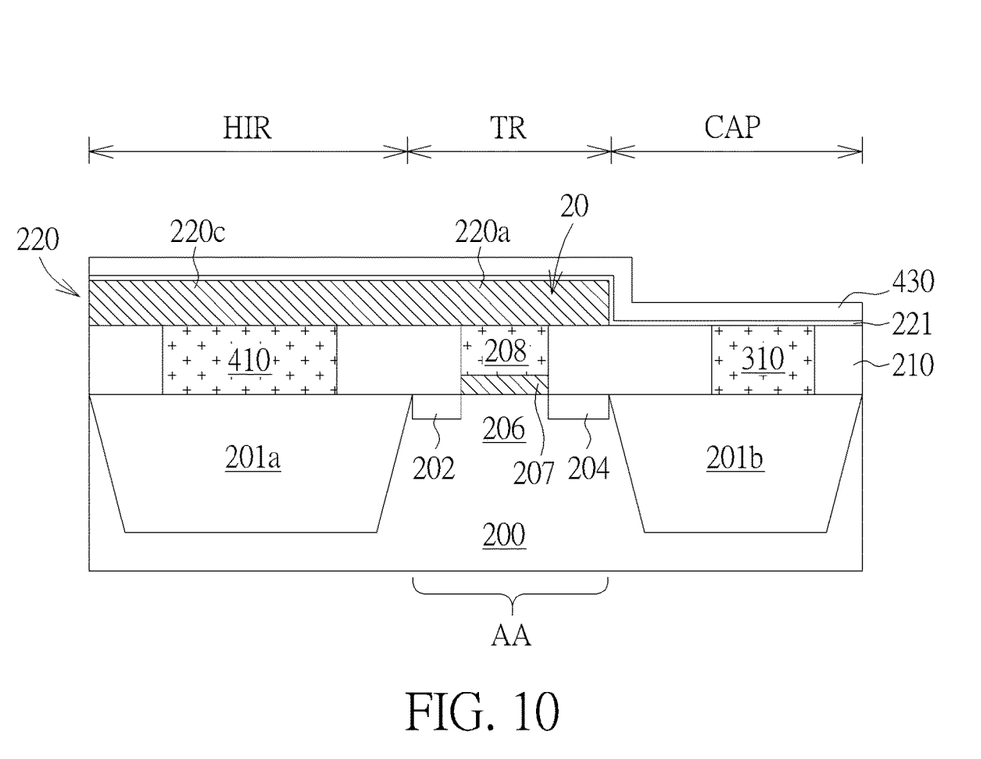

As shown in FIG. 10, next, a capacitor dielectric layer 221 and a high-resistance metal layer 430 are sequentially deposited on the substrate 200 to cover the transistor forming region TR, the capacitor forming region CAP, and the resistor forming region HIR. According to an embodiment of the present invention, the capacitor dielectric layer 221 may include, for example, silicon oxide, aluminum oxide, hafnium oxide, tantalum oxide, zirconium oxide, etc., and the high-resistance metal layer 430 may include, for example, titanium nitride or tantalum nitride.

Figure 11:
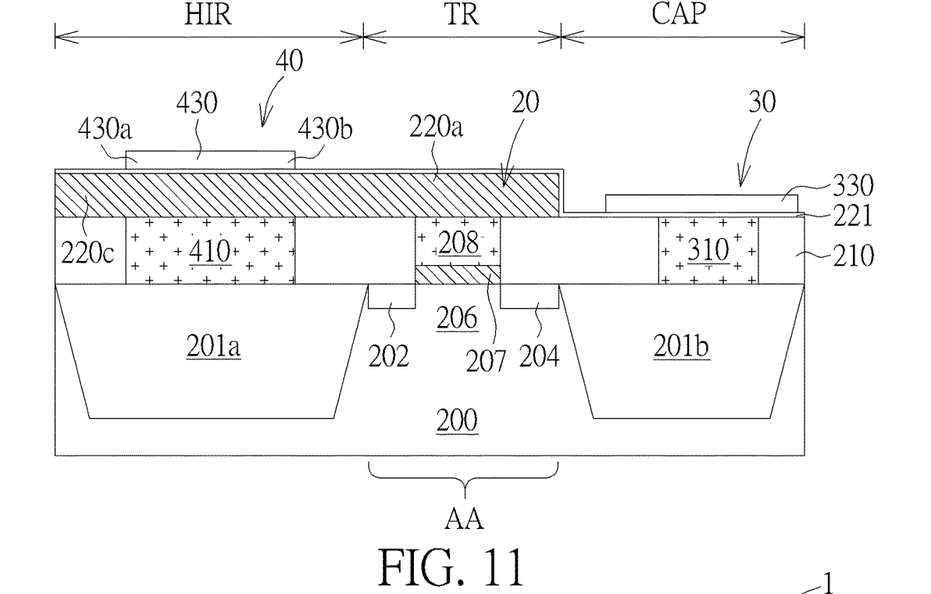

As shown in FIG. 11, next, using a lithographic process and an etching processes, the high-resistance metal layer 430 is patterned into the resistor 40 and the top plate 330 of the capacitor 30 in the resistor forming region HIR and the capacitor forming region CAP, respectively. The resistor 40 has two terminals 430a and 430b, which are cathode and anode, respectively.

Figure 12:
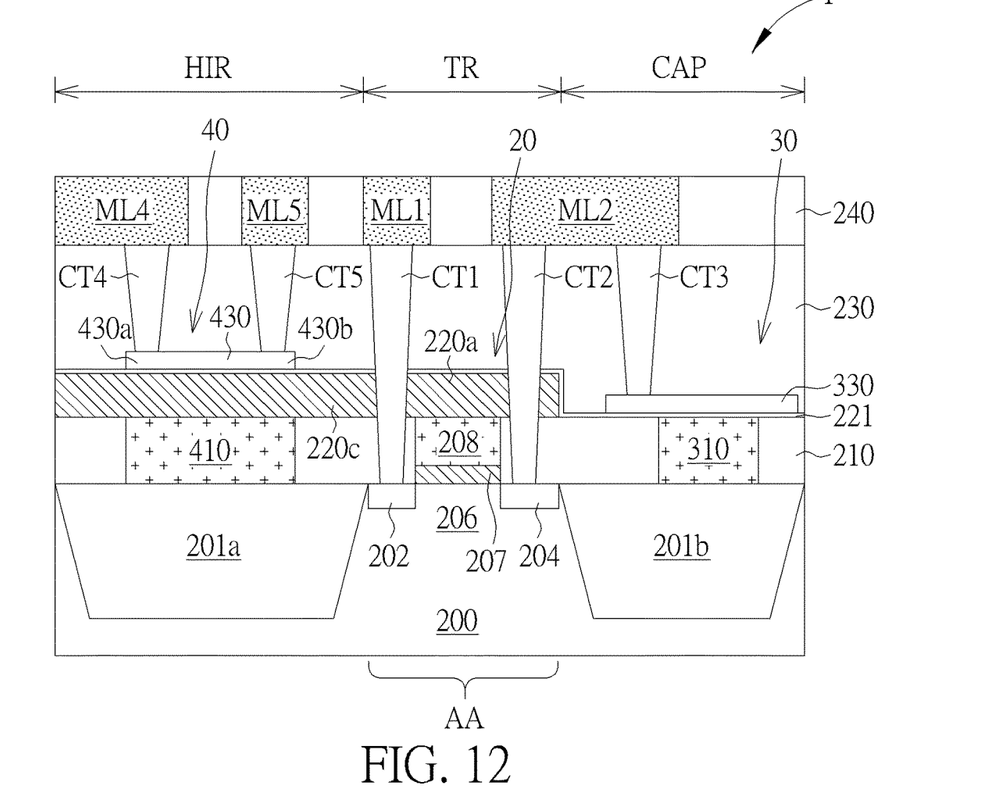

As shown in FIG. 12, next, an interconnection process is performed. A first interlayer dielectric layer 230 is formed on the substrate 200 to cover the transistor forming region TR, the capacitor forming region CAP and the resistor forming region HIR. Subsequently, plugs CT1 to CT5 are formed in the first interlayer dielectric layer 230. An intermetal dielectric layer 240, for example, a low-k dielectric layer or an ultra-low-k dielectric layer is then deposited on the first interlayer dielectric layer 230. Then, interconnects ML1 to ML5 are formed in the intermetal dielectric layer 240. The plugs CT1 and CT2 penetrate downward through the capacitor dielectric layer 221, the first portion 220a of the cap layer 220, and the first interlayer dielectric layer 210, and are electrically connected to the doped region 202 and the doped region 204 of the transistor 20, respectively. The plug CT1 is electrically connected to the interconnect ML1 located in the intermetal dielectric layer 240. The plug CT2 is electrically connected to the interconnect ML2 located in the intermetal dielectric layer 240, and is then electrically connected to the top plate 330 via the plug CT3. The interconnects ML4 and ML5 in the intermetal dielectric layer 240 are electrically connected to the two terminals 430a and 430b of the resistor 40 through the plugs CT4 and CT5, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory structure, comprising:
a substrate having thereon a transistor forming region and a capacitor forming region in proximity to the transistor forming region;
a transistor disposed on the substrate within the transistor forming region;
a capacitor disposed on the substrate within the capacitor forming region and electrically coupled to a terminal of the transistor;
a first interlayer dielectric layer covering the transistor forming region and the capacitor forming region, wherein the first interlayer dielectric layer surrounds a metal gate of the transistor and a bottom plate of the capacitor; and
a cap layer disposed on the first interlayer dielectric layer, wherein the cap layer has a first thickness within the transistor forming region and a second thickness within the capacitor forming region, wherein the first thickness is greater than the second thickness, wherein the cap layer within the capacitor forming region acts as a capacitor dielectric layer of the capacitor.

2. The semiconductor memory structure according to claim 1, wherein the capacitor further comprises:
a top plate on the cap layer within the capacitor forming region.

3. The semiconductor memory structure according to claim 2 further comprising:
a second interlayer dielectric layer covering the cap layer and the top plate.

4. The semiconductor memory structure according to claim 2, wherein the top plate comprises titanium nitride or tantalum nitride.

5. The semiconductor memory structure according to claim 1, wherein the bottom plate is a metal gate bottom plate.

6. The semiconductor memory structure according to claim 1, wherein the bottom plate is coplanar with the metal gate of the transistor.

7. The semiconductor memory structure according to claim 1, wherein the first thickness is about 200-300 angstroms and the second thickness is about 20-50 angstroms.

8. The semiconductor memory structure according to claim 1, wherein the cap layer is a silicon oxide layer.

9. The semiconductor memory structure according to claim 1, wherein the cap layer has a composition in the transistor forming region different from that of the cap layer in the capacitor forming region.

10. The semiconductor memory structure according to claim 1 further comprising:
a trench isolation structure in the substrate within the capacitor forming region, wherein the bottom plate is disposed directly on the trench isolation structure.

11. A method of forming a semiconductor memory structure, comprising:
providing a substrate having thereon a transistor forming region and a capacitor forming region in proximity to the transistor forming region;
forming a transistor on the substrate within the transistor forming region;
forming a capacitor on the substrate within the capacitor forming region and electrically coupled to a terminal of the transistor;
forming a first interlayer dielectric layer covering the transistor forming region and the capacitor forming region, wherein the first interlayer dielectric layer surrounds a metal gate of the transistor and a bottom plate of the capacitor; and
forming a cap layer on the first interlayer dielectric layer, wherein the cap layer has a first thickness within the transistor forming region and a second thickness within the capacitor forming region, wherein the first thickness is greater than the second thickness, wherein the cap layer within the capacitor forming region acts as a capacitor dielectric layer of the capacitor.

12. The method according to claim 11, wherein said forming the capacitor further comprises:
forming a top plate on the cap layer within the capacitor forming region.

13. The method according to claim 12 further comprising:
forming a second interlayer dielectric layer covering the cap layer and the top plate.

14. The method according to claim 12, wherein the top plate comprises titanium nitride or tantalum nitride.

15. The method according to claim 11, wherein the bottom plate is a metal gate bottom plate.

16. The method according to claim 11, wherein the bottom plate is coplanar with the metal gate of the transistor.

17. The method according to claim 11, wherein the first thickness is about 200-300 angstroms and the second thickness is about 20-50 angstroms.

18. The method according to claim 11, wherein the cap layer is a silicon oxide layer.

19. The method according to claim 11, wherein the cap layer has a composition in the transistor forming region different from that of the cap layer in the capacitor forming region.

20. The method according to claim 11 further comprising:
forming a trench isolation structure in the substrate within the capacitor forming region, wherein the bottom plate is disposed directly on the trench isolation structure.

* * * * *